(12) United States Patent
Tennen et al.

(10) Patent No.: US 6,531,902 B1
(45) Date of Patent: Mar. 11, 2003

(54) LINE DRIVER OPERATIVE FROM A SINGLE SUPPLY AND METHOD FOR SUPPLYING VOLTAGES TO A LOAD

(75) Inventors: Aner Tennen, Marlboro, NJ (US); Joseph J. Klesh, North Bergen, NJ (US)

(73) Assignee: Globespanvirata, Inc., Red Bank, NJ (US)

( * ) Notice: Subject to any disclaimer, the term of this patent is extended or adjusted under 35 U.S.C. 154(b) by 0 days.

(21) Appl. No.: 10/044,726

(22) Filed: Jan. 11, 2002

Related U.S. Application Data
(60) Provisional application No. 60/261,419, filed on Jan. 11, 2001.

(51) Int. Cl.[7] .............................. H03K 3/00; G05F 1/10
(52) U.S. Cl. ...................... 327/108; 327/536; 327/538
(58) Field of Search ................................. 327/536, 537, 327/589, 390, 538, 539, 540, 541, 543, 544, 545, 546, 560, 108

(56) References Cited

U.S. PATENT DOCUMENTS 5,757,170 A * 5/1998 Pinney ........................ 327/538
6,285,242 B1 * 9/2001 Hardee ........................ 327/536
6,400,211 B1 * 6/2002 Yokomizo et al. .......... 327/536
6,476,656 B2 * 11/2002 Dally et al. ................. 327/540

OTHER PUBLICATIONS

Tanimoto, U.S. patent application Publication 2002/0,053, 942, Pub.Date May 9, 2002, Ser. No. 10/010,396, Filed Nov. 5, 2001.*

Roberts et al., U.S. patent application Publication 2001/0, 028,270, Pub. Date Oct. 11, 2001, Ser. No. 09/883,048 Filed Jun. 15, 2001.*

* cited by examiner

Primary Examiner—Toan Tran
(74) Attorney, Agent, or Firm—Thomas, Kayden, Horstemeyer & Risley

(57) ABSTRACT

A line driver is disclosed. Generally, the structure of the line driver contains an amplifier stage that can operate at various voltage levels. The first external supply voltage is connected to a first power supply input of the amplifier stage. The line driver also includes a charge pump that generates at least a first internal supply voltage supplied to the amplifier stage. A switch control circuit is also included within the line driver to regulate the voltage output from the charge pump. Systems and methods for supplying various voltages to a load are also disclosed.

25 Claims, 7 Drawing Sheets

LINE DRIVER OPERATIVE FROM A SINGLE SUPPLY AND METHOD FOR SUPPLYING VOLTAGES TO A LOAD

CROSS-REFERENCE TO RELATED APPLICATIONS

This application claims the benefit of U.S. Provisional Application Ser. No. 60/261,419, filed on Jan. 11, 2001 and entitled "Single Supply for Class-G xDSL Line Driver," which is incorporated by reference herein in its entirety.

FIELD OF THE INVENTION

The present invention generally relates to switched supplies systems and, more particularly, to line driver technology for xDSL communication.

BACKGROUND OF THE INVENTION

With advancements in technology, the transmission of voice and data at faster rates and in larger volumes is always in demand. One solution to fulfilling these demands is digital subscriber line (DSL) technology. DSL technology has been introduced into the field of broadband networking, among other reasons, to overcome issues faced by traditional voice band technology. Such issues include, but are not limited to, bandwidth limitations. Multiple DSL technologies exist including, but not limited to, rate adaptive DSL (RADSL), symmetric DSL (SDSL), multi-rate SDSL (M/SDSL), high bit-rate DSL (HDSL), very high bit-rate DSL (VDSL), and asymmetric DSL (ADSL).

ADSL technology utilizes the infrastructure already in place in a public switched telephone network (PSTN), including copper loops, constructed of copper wires, between a customer premise and a central office. Advantageously, ADSL technology does not require replacement of network equipment such as routers, switches, firewalls and Web servers, which are commonly used in today's paradigm for broadband access.

A DSL modem provides communication capabilities for the transmission and receipt of information utilizing ADSL technology. Typically, discrete multi-tone (DMT) line coding is utilized by the DSL modem for the transmission of DMT symbols from a source to a destination.

Due to its Gaussian-like distribution, DMT signals are characterized by a very high peak to RMS ratio (PAR), also known as crest factor, which is typically around 15 dB. Occasionally, high-peak signals are transmitted. Generally, a high crest factor indicates that a signal has rare, but large, deviations from its normal levels, while a smaller crest factor indicates the easier it is to manipulate and transmit the signal. One of the problems of high crest factor signals is high-power consumption by the modem, specifically, by a line driver located within the modem, that is caused by high voltage supply rails required to accommodate the large and rare signal peaks.

To improve power consumption levels of line drivers for high crest factor signals, which occur at different times during the transmission of DMT symbols, a multi-level power supply, or line driver, is typically utilized (i.e., Class G line driver). The multi-level line driver comprises a high-power supply rail and a low-power supply rail. For transmission of signals having a typical level, the line driver output signal is bounded by the low-power supply rail. However, when an indication of a high crest factor signal is received, the line driver, having a multi-level power supply, switches to the high-power supply rail to accommodate for the high crest factor signal. Switching between high and low-power supply rails is performed when a signal crosses a predetermined voltage level. In this context, the term crest factor signal is defined to describe a segment of the signal in which the signal had a peak voltage level higher then the predetermined voltage level. At the present time, Class-G line drivers are implemented by using between three to four external power supplies. The power supplies used are usually of the switch mode type to improve efficiency. The required power supplies are separate from the Class-G line driver, and therefore require additional board space and cost. To that, since the required voltages are produced separate from the line drivers, there is no direct control of these voltages in the design and/or fabrication of the line drivers themselves, and so the line driver engineers do not have the opportunity to optimize the efficiency. Therefore, a system and method for traversing the need for multiple external power supplies is desired.

SUMMARY OF THE INVENTION

In light of the foregoing, a line driver is disclosed. Generally, the structure of the line driver contains an amplifier stage that can operate at various voltage levels. The first external supply voltage is connected to a first power supply input of the amplifier stage. The line driver also includes a charge pump that generates at least a first internal supply voltage supplied to the amplifier stage. A switch control circuit is also included within the line driver to regulate the voltage output from the charge pump.

The present invention can also be viewed as a method for supplying various voltages to a load. In this regard, the method can be broadly summarized by the following steps: generating an internal supply voltage from an external supply voltage, wherein the internal supply voltage is less than the external supply voltage; supplying the first internal supply voltage to the load; and regulating the generation and supply of the first internal supply voltage.

Other systems and methods of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components of the drawings are not necessarily to scale, emphasis instead being placed upon clearly illustrating the principles of the present invention. Moreover, in the drawings, like referenced numerals designate corresponding parts throughout the several views.

DETAILED DESCRIPTION OF THE INVENTION

Figure 1:
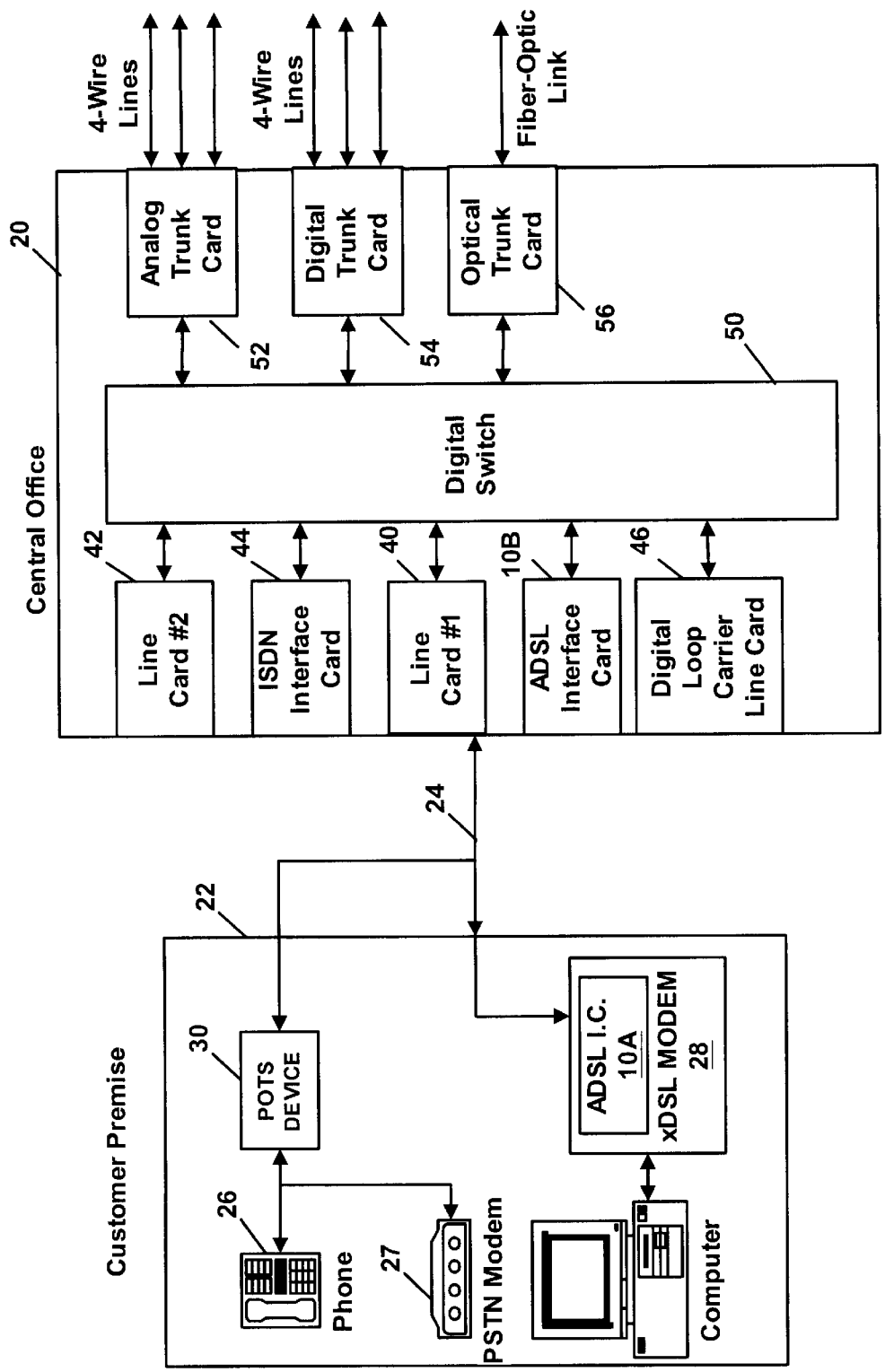
FIG. 1 is a block diagram of a communication system 12 in which the present invention may be provided.

Turning now to the drawings, wherein like referenced numerals designate corresponding parts throughout the drawings, FIG. 1 is a block diagram of a communication system 12 in which an embodiment of the present invention may be provided. Specifically, FIG. 1 illustrates communication between a central office 20 and a customer premise 22 by way of a local loop 24. While the customer premise 22 may be a single dwelling residence, a small business, or other entity, it is generally characterized as having POTS equipment, such as a telephone 26, PSTN modem 27, fax machine (not shown), etc. The customer premise 22 may also include an xDSL communication device, such as an xDSL modem 28, comprising an ADSL interface card 10A for handling ADSL services. When an xDSL service is provided, such as, but not limited to, ADSL, a POTS filter 30 is interposed between the POTS equipment 26 and the local loop 24. As is known, the POTS filter 30 includes a low-pass filter in order to filter high frequency transmissions from the xDSL communication device 28 and protect the POTS equipment.

It should be noted that although the present disclosure is made with reference to ADSL technology, one skilled in the art will appreciate that other DSL technologies requiring the mitigation of distortion attributed to power supply rail switching may also be provided for by the present technique.

Additional circuitry is provided at the central office 20. Generally, a line card 40 containing line interface circuitry is provided for electrical connection to the local loop 24. In fact, multiple line cards may be provided 40, 42 to serve as a plurality of local loops 24. In the same way, additional circuit cards are typically provided at the central office 20 to handle different types of services. For example, an integrated services digital network (ISDN) interface card 44, a digital loop carrier line card 46, and other circuit cards, for supporting similar and other communication services, may be provided. Particular to the present synchronization system, an ADSL interface card 10B may also be provided at the central office 20, also for handling ADSL services. It should be noted that the ADSL interface card 10A (or 10B) might alternatively be located exclusively at the central office 20, or exclusively at the customer premise 22.

A digital switch 50 is also provided at the central office 20 and is disposed for communication with each of the various line cards 40, 42, 44, 46, 10B. On the outgoing side of the central office 20 (i.e., the side opposite the various local loops), a plurality of trunk cards 52, 54, 56 are typically provided. Typically, these cards have outgoing lines that support numerous multiplexed transmissions and are typically destined for other central offices or long distance toll offices.

Figure 2:
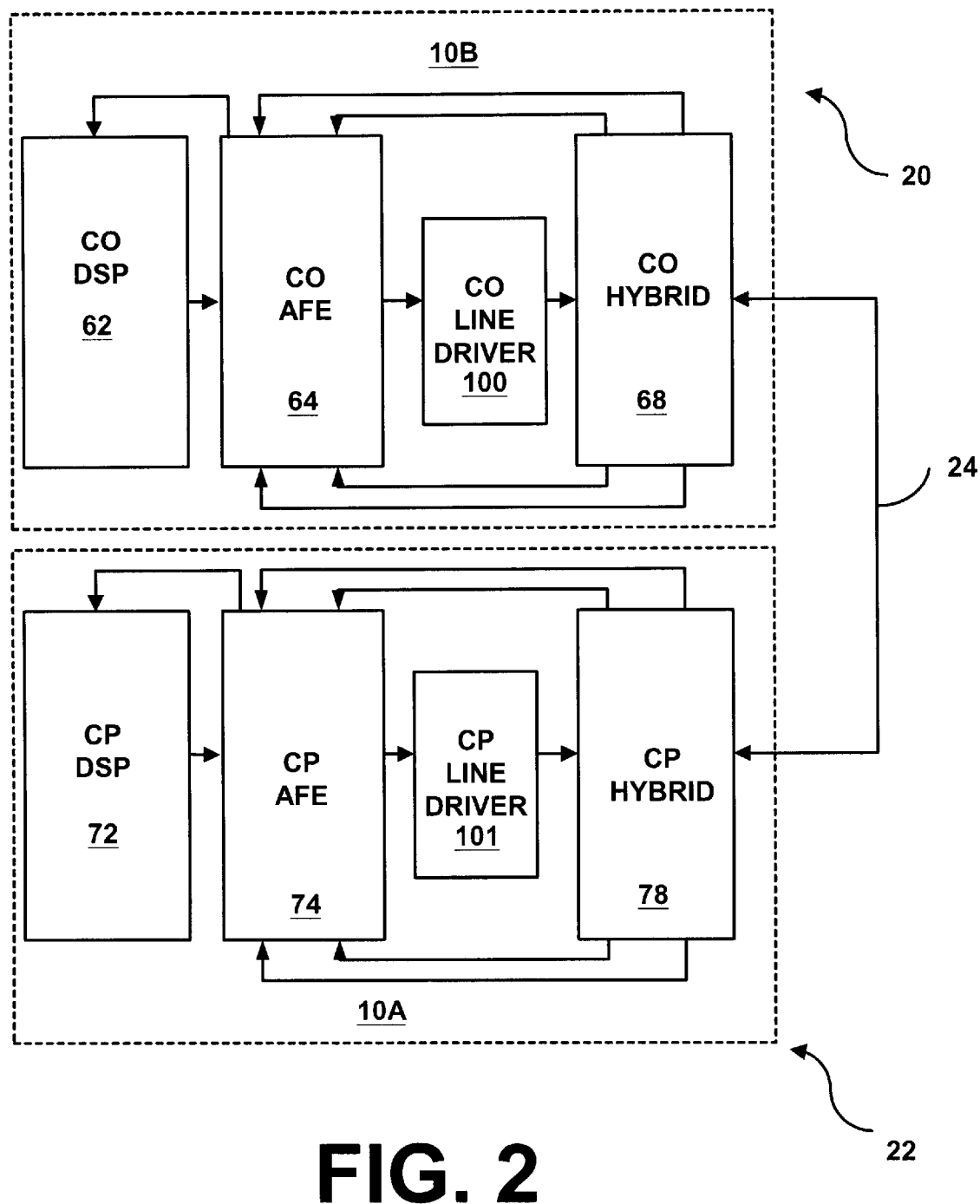
FIG. 2 is a block diagram further illustrating a connection between the ADSL interface card of the central office and the ADSL interface card of the customer premise, both of which are shown by FIG. 1.

FIG. 2 is a block diagram further illustrating a connection between the ADSL interface card 10B of the central office 20 and the ADSL interface card 10A of the customer premise 22 (FIG. 1). Transmission of data may be directed from the customer premise 22 to the central office 20, from the central office 20 to the customer premise (CP) 22, or in both directions at the same time. The ADSL interface card 10B located within the central office (CO) 20 comprises a CO DSP 62, which receives information from a data source (not shown) and sends information to a CO analog front end (AFE) 64. The CO AFE 64 interfaces between the local loop 24 and the CO DSP 62 and functions to convert digital data, from the CO DSP 62, into a continuous time analog signal.

The analog signal is delivered, via a CO line driver 100, in accordance with the amount of power required to drive the amplified analog signal through the local loop 24 and to the CP 22. A CP hybrid 68, located in the CP 22, is then used to de-couple the received signal from the transmitted signal, by subtracting the transmitted signal from the sum of the transmitted and received signals. A CP AFE 74, located in the CP 22, then converts the received analog signal into a digital signal, which is then transmitted to a CP DSP 72 located in the CP 22. The CP DSP 72 then transmits the digital information to the data source specified to receive the information.

If, however, an analog signal is delivered from the CP 22 to the CO 20, a CP line driver 101 will deliver the signal in accordance with the amount of power required to drive the amplified analog signal through the local loop 24 and to the CO 20. A CO hybrid 68, located in the CO 20, is then used to de-couple the received signal from the transmitted signal, by subtracting the transmitted signal from the sum of the transmitted and received signal. The CO AFE 64, located in the CO 20, then converts the received analog signal into a digital signal, which is then transmitted to the CO DSP 62 located in the CO 20. Finally, the digital information is transmitted to the data source specified to receive the information.

One method used to enable transmission of high crest factor signals is for the line driver 100, 101 to utilize a high level of power at all times, such that when a high crest factor signal is transmitted to the loop 24, towards the destination, the signal is compensated for and may properly be transmitted. Unfortunately, this method consumes vast amounts of power and, therefore, is not efficient.

Alternatively, to compensate for high crest factor signals, line drivers 100, 101 utilized by an embodiment of the present invention comprise a high-power supply rail and a low-power supply rail. This configuration is characteristic of Class-G line drivers, which due to the Gaussian-like nature of DSL signals, typically bind output signals to the low-power supply rail. When a determination is made that a high crest factor signal will be encountered, the line driver 100, 101 then switches to the high-power supply rail to properly compensate for, and properly transmit, the high crest factor signal. One method utilized to determine if a high crest factor signal will be encountered is by the DSP transmitting a "peak look ahead" command. The line drivers 100 and 101 are embodiments of the present invention and will be described further herein.

Figure 3:
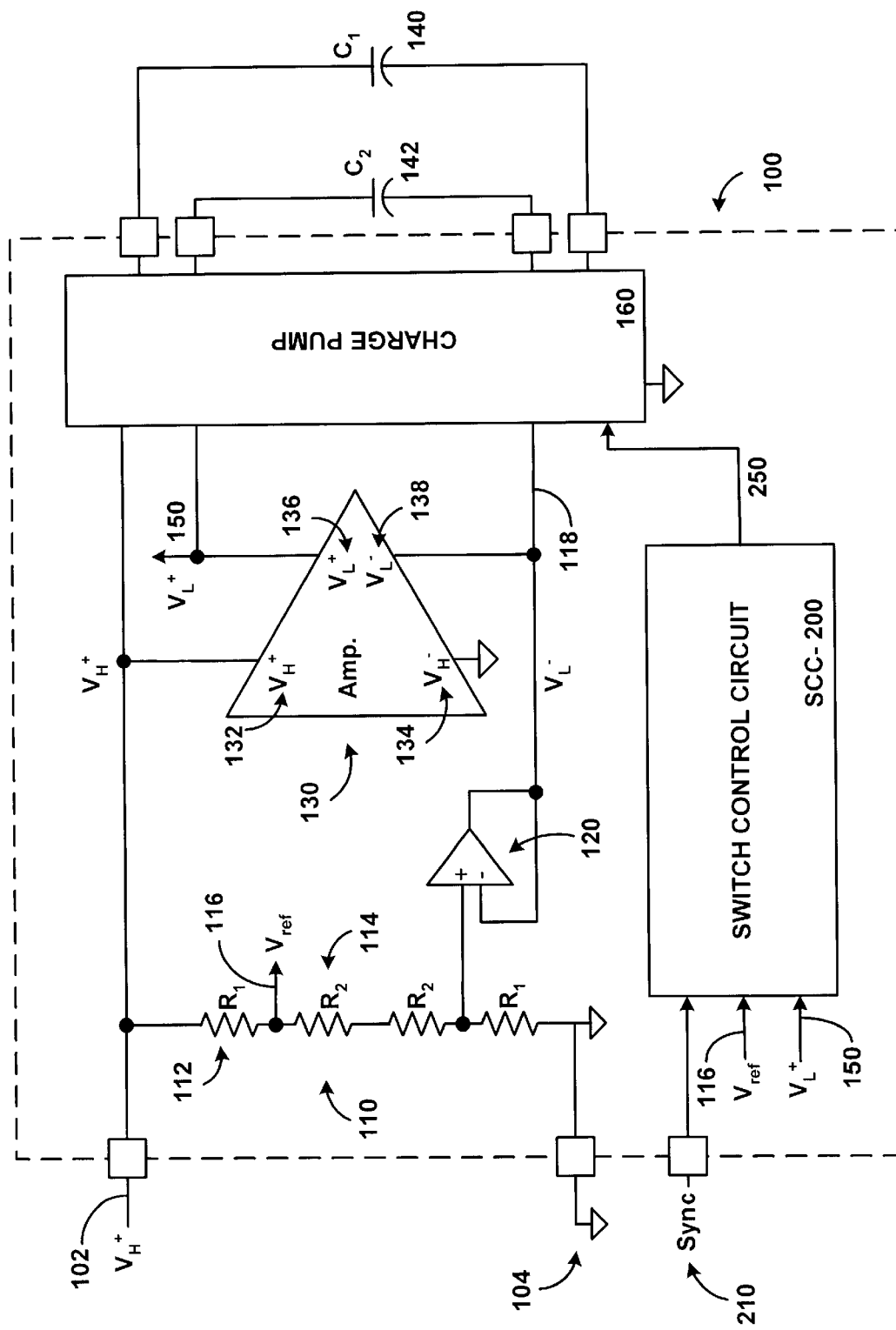
FIG. 3 is a circuit diagram of an embodiment of the present invention.

FIG. 3 is a circuit diagram of the line driver 100 as described in one embodiment of the present invention. Input and output stages of the line driver have been excluded from the circuit diagram for the purpose of simplicity. An external supply voltage ($V_H^+$) 102 is supplied to the line driver 100 from an external power supply (not shown). The $V_H^+$ is coupled with a voltage divider 110 and is also fed in to supply a Class-G amplifier stage 130. The $V_H^+$ is terminated at a charge pump 160. Ground 104 is also supplied to the line driver 100 and is coupled to the reciprocal end of the voltage divider 110 and is fed in to ground the Class-G amplifier stage 130. Ground 104 is terminated at the charge pump 160. An optional synchronization signal (Sync) 210 can be supplied to the line driver 100 and is input to a switch control circuit 200. Two capacitors, ($C_1$) 140 and ($C_2$) 142, are coupled with the line driver 100 and, for the purpose of this discussion, incorporated within the charge pump 160.

The voltage divider 110 is configured to generate several different reference voltages 116. Resistors $R_1$ 112 and $R_2$ 114 are connected in series across the voltage divider 110. Two resistor $R_1$'s 112 and two resistor $R_2$'s 114 are depicted in this embodiment. More resistors could be connected within the voltage divider. Generally, the more resistors in the voltage divider, the more reference voltages ($V_{ref}$) 116 that could be generated. The values of $R_1$ 112 and $R_2$ 114 may be similar or may not be. Voltage dividers and their general configurations are well known in the art and so no further discussion is necessary. It is important to note, however, that the reference voltages, Vref, will be between the $V_H^+$ 102 and ground 104.

A buffer amplifier 120 is coupled with the voltage divider 110 to produce a buffered reference voltage without any current. The buffered reference voltage ($V_L^-$) 118 is output to the Class-G amplifier stage 130 as well as the charge pump 160.

The Class-G amplifier stage 130 may contain several internal amplifier stages. Two power supply rails are depicted in the circuit diagram although more could be used. A high-power supply rail with input terminals 132 and 134 are coupled with the $V_H^+$ and ground 104, respectively. A low-power supply rail with input terminals 136 and 138 are coupled with an internal supply voltage ($V_L^+$) carried on line 150 and the buffered reference voltage ($V_L^-$) carried on line 118 from the buffer amplifier 120, respectively. The $V_L^+$ is generated and supplied by the charge pump 160. Typically, the Class-G amplifier stage 130 would have an input signal and an output signal, wherein the amplifier stage 130 would modify the input signal to produce the output signal. The overall functionality of the amplifier stage 130, generally, is not pertinent to the present discussion and so has been excluded. Of importance, though, is that the Class-G amplifier stage 130 has a selector system that can select which power supply rail to use. The rails can switch in mid-operation and, typically, are controlled by the magnitude of the input signal.

The switch control circuit 200, as mentioned earlier, can receive the optional Sync signal 210. The switch control circuit 200 also receives, as inputs, the reference voltage 116 from the voltage divider 110 and $V_L^+$ from the charge pump 160. A control signal 250 is delivered from the switch control circuit 200 to the charge pump 160. Generally, the control signal 250 contains information that will regulate the generation and supply of the $V_L^+$ by the charge pump 160. The components and general functionality of the switch control circuit 200 will be further described herein in later figures.

The charge pump 160, as mentioned, receives the $V_H^+$ and ground 104 from an external supply. The control signal 250 is received from the switch control circuit 200. The $V_L^+$ is generated by the charge pump 160 and supplied to the amplifier stage 130. As mentioned, $C_1$ 140 and $C_2$ 142 are part of the charge pump 160 but may be external to the line driver 100. This allows for flexibility in the design of the line driver 100. The components and general functionality of the charge pump 160 will be further described herein in later figures.

Figure 4:
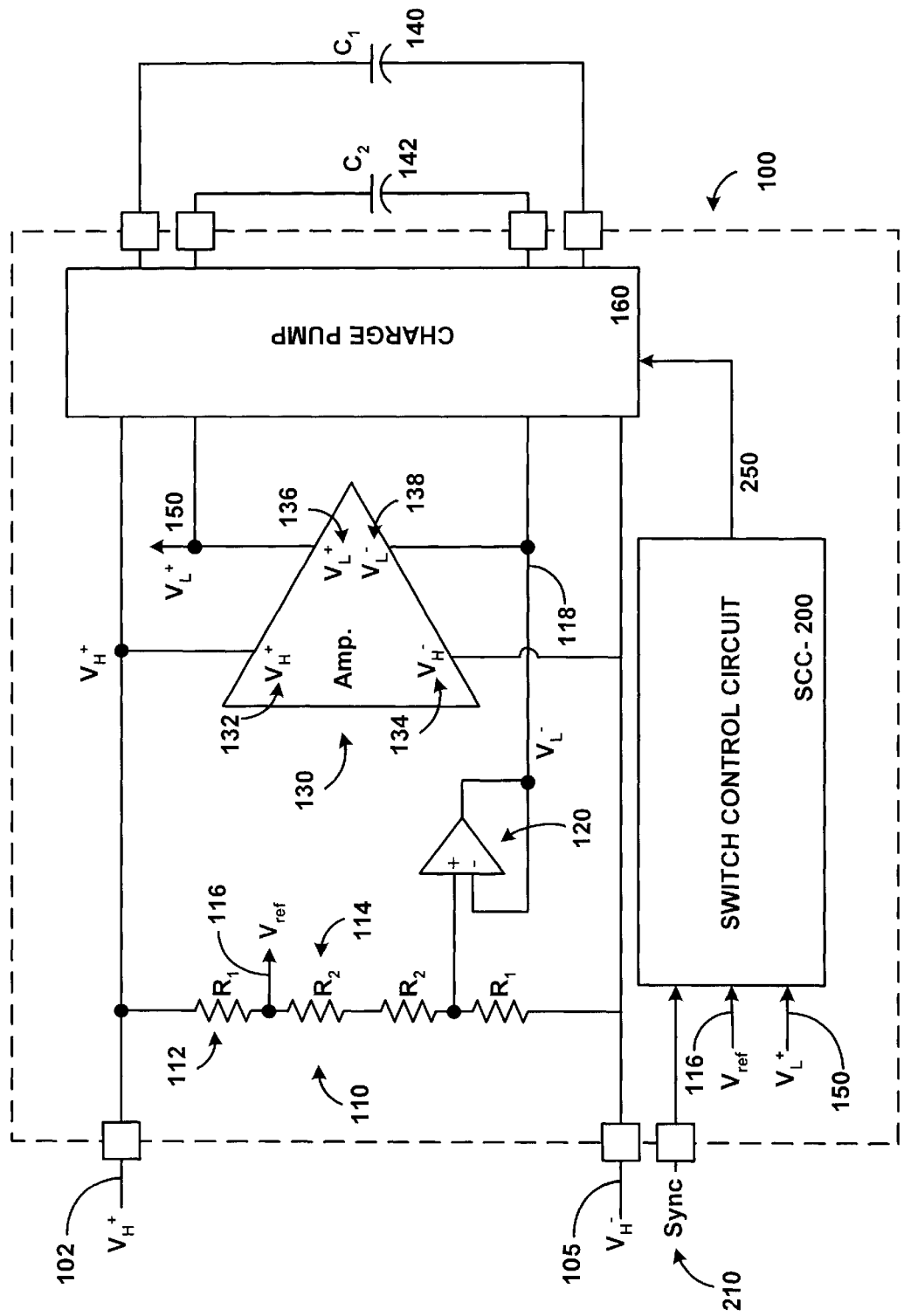
FIG. 4 is a circuit diagram of another embodiment of the present invention.

FIG. 4 is a circuit diagram of another embodiment of the present invention. The embodiment described in FIG. 4 is similar to that of FIG. 3 except that the ground 104 is replaced with a second external supply voltage ($V_H^-$) 105 which is supplied to the line driver 100. $V_H^-$ 105 is coupled to the reciprocal end of the voltage divider 110 and is also fed in to supply the Class-G amplifier stage 130. $V_H^-$ 105 is terminated at the charge pump 160.

This allows for flexibility in the design of the line driver. Some amplifier stages could operate, for example, within +10V DC and 0V DC. In that case, the embodiment of FIG. 3 may be preferred. If the amplifier stage operated in a range of +5V DC and −5V DC, then the embodiment of FIG. 4 may be preferred.

Figure 5:
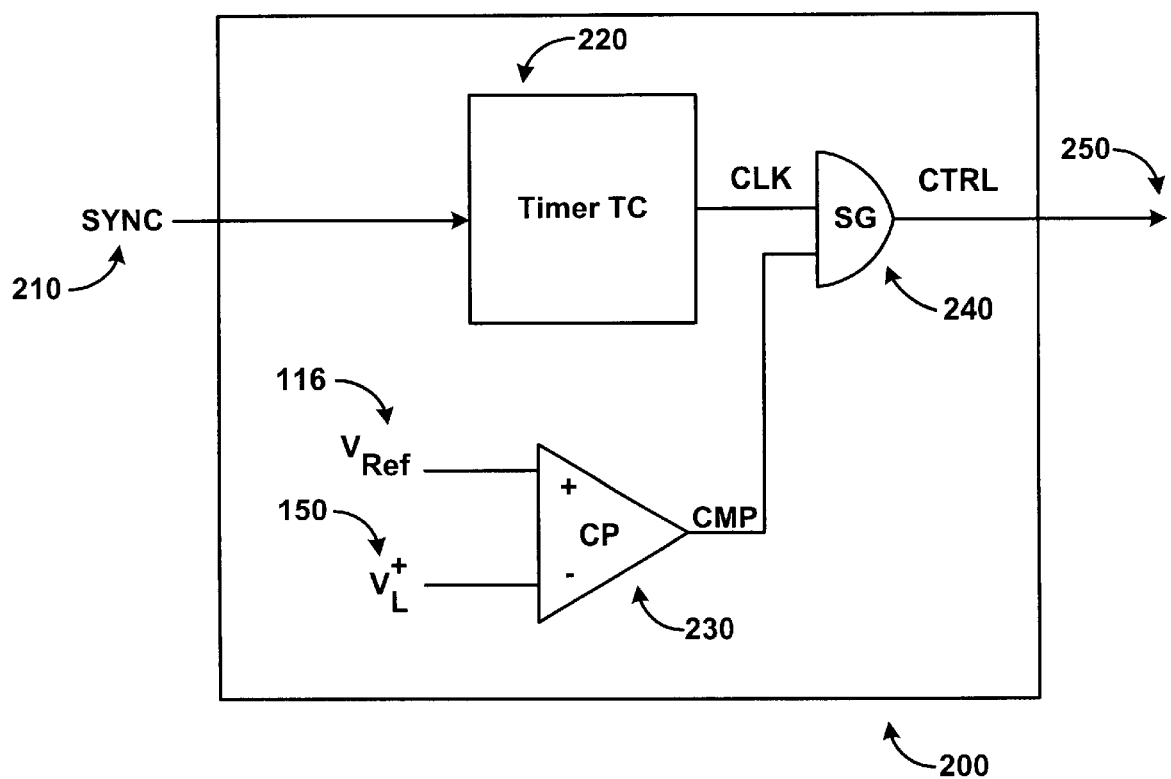
FIG. 5 is a block diagram of the switch control circuit of the embodiment of FIG. 3.

FIG. 5 is a functional block diagram of the switch control circuit 200 of FIG. 3 and FIG. 4. As mentioned above, the optional synchronization signal (Sync) 210 is received from an external source and is input to a timing circuit 220, which generates a synchronized clock. Otherwise, the timing circuit 220 generates a free running clock signal that is output to a switch control gate 240. The clock signal could be, for instance, a square wave signal and can have a particular frequency. The clock signal may be varied in the design stage based upon, for example, the particular switches used in the charge pump 160, the capacitors 140 and 142, and the Class-G amplifier stage 130.

A comparator 230 compares the internal supply voltage ($V_L^+$) 150 and the reference voltage ($V_{ref}$) 116. The comparator 230 may also generate an upper threshold voltage based upon $V_{ref}$. $V_L^+$ is received from the charge pump 160 and $V_{ref}$ is received from the voltage divider 110. A compare signal is output from the comparator 230 to the switch control gate 240. In practice, if $V_L^+$ is less than $V_{ref}$, a logical "1" or a high voltage could be sent to the switch control gate 240. When $V_L^+$ exceeds the upper threshold voltage a logical "0" or a low voltage could be sent to the switch control 240. When the switch control gate 240 receives the logical "1" or a high voltage it could become enabled and the clock signal could be passed through the gate 240 and sent as the control signal 250 to the charge pump. When the logical "0" or the low voltage is received by the gate 240 it could be disabled and the gate 240 would block the clock signal.

Figure 6:
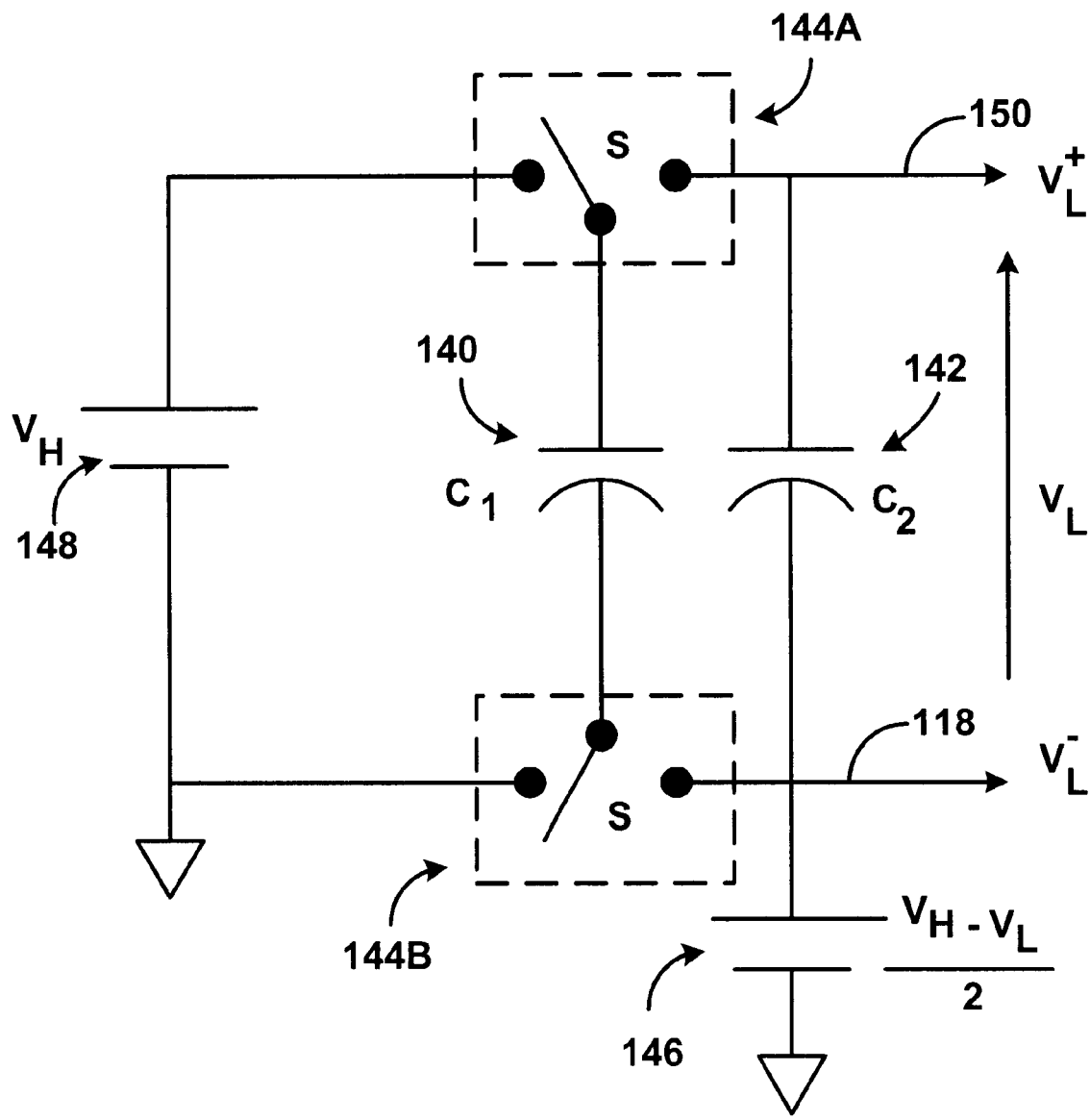
FIG. 6 is a circuit diagram of the charge pump of the embodiment of FIG. 3.

FIG. 6 is a circuit diagram of the charge pump 160 of the line driver 100 of FIG. 3. The charge pump 160 generates and supplies the internal supply voltage ($V_L^+$) 150 to the amplifier stage 130. The charge pump 160 contains two capacitors ($C_1$) 140 and ($C_2$) 142. Typically, the capacitance of $C_1$ 140 will be less than $C_2$ 142. $C_1$ 140 is connected across poles of two switches ($S_1$) 144A and ($S_2$) 144B. One throw of $S_1$ 144A is connected to the first external supply voltage ($V_H^+$) 102 (See FIG. 3) and one throw of $S_2$ 144B is connected to the second external supply voltage ($V_H^-$) 105 (See FIG. 4) or ground 104. The other throw of $S_1$ 144A is connected to one end of $C_2$ 142 and the other throw of $S_2$ 144B is connected to the other end of $C_2$ 142. The voltage at the positive terminal of $C_2$ 142 is $V_L^+$ and the voltage at the negative terminal of $C_2$ 142 is the buffered reference voltage, $V_L^-$ 118, from the buffer amplifier 120 (See FIG. 3). Voltages 148 and 146 are included for symbolical representation. Source 148 is a representation of the external power supply and source 146 is a representation of the voltage level produced by the voltage divider 110. The voltage level of source 146 may vary by the configuration of the voltage divider 110.

The operation of the charge pump 160 is based on the principle of transferring a portion of charge from the small value capacitor, $C_1$ 140, charged to the large voltage $V_H$, to the larger capacitor $C_2$ 142, charged to the smaller voltage $V_L$. The incremental change in the voltage on $C_2$ 142, when charge is transferred from $C_1$ 140 is based on the ratio between the capacitances of $C_1$ 140 and $C_2$ 142.

In operation, when switches $S_1$ 144A and $S_2$ 144B are connected across the external supply voltage 148, then $C_1$ 140 is charged to $V_H^+$. When $S_1$ 144A and $S_2$ 144B are connected to the $C_2$ 142, then the charge on $C_1$ 140 is partially transferred to $C_2$ 142, causing the voltage across $C_2$ 142 to increase. By setting the ratio of $C_1$ 140 to $C_2$ 142, the increase in the voltage across $C_2$ may be controlled. When the charge on $C_1$ 140 is transferred to $C_2$ 142, $S_1$ 144A and $S_2$ 144B reconnect $C_1$ 140 to the external supply 148. $C_2$ 142 supplies the lower voltage $V_L$, defined as the difference between $V_L^+$ and $V_L^-$, to the Class-G amplifier stage 130.

The internal supply voltage $V_L^+$ is sampled across $C_2$ 142 and is sent to the comparator 230 of the switch control circuit 200, and if this voltage drops below $V_{ref}$ then $S_1$ 144A and $S_2$ 144B operate, and the charge on $C_1$ 140 is transferred to $C_2$ 142. As discussed above the switch control circuit 200 outputs a control signal 250 to the charge pump 160. The control signal 250 operates the switches $S_1$ 144A and $S_2$ 144B. When the switch control gate 240 is enabled, the clock signal is passed through via the control signal 250 to the switches $S_1$ 144A and $S_2$ 144B. This signal causes $S_1$ 144A and $S_2$ 144B to alternately flip $C_1$ 140 between the external voltage 148 and $C_2$ 142. The rate at which $S_1$ 144A and $S_2$ 144B operate is determined by the frequency of the clock signal produced by the timing circuit 220. This will continue until $V_L^+$ rises above the upper threshold voltage of the comparator, in which case, $S_1$ 144A and $S_2$ 144B keep $C_1$ 140 connected across the external voltage 148. Generally, this will produce $V_L^+$ having a small ripple, shaped as a triangle wave, riding on a DC level that is regulated at $V_{ref}$.

As previously mentioned, the capacitance of $C_2$ 142 is usually much greater than that of $C_1$ 140. Thus, $C_2$ 142 can be quickly charged by $C_1$ 140 and slowly discharged by the load current flowing through the amplifier stage's 130 low voltage supplies 136 and 138. The larger the capacitance of $C_2$ 142, the more current it can supply to the amplifier stage (or load) 130 while discharging slowly.

Figure 7:
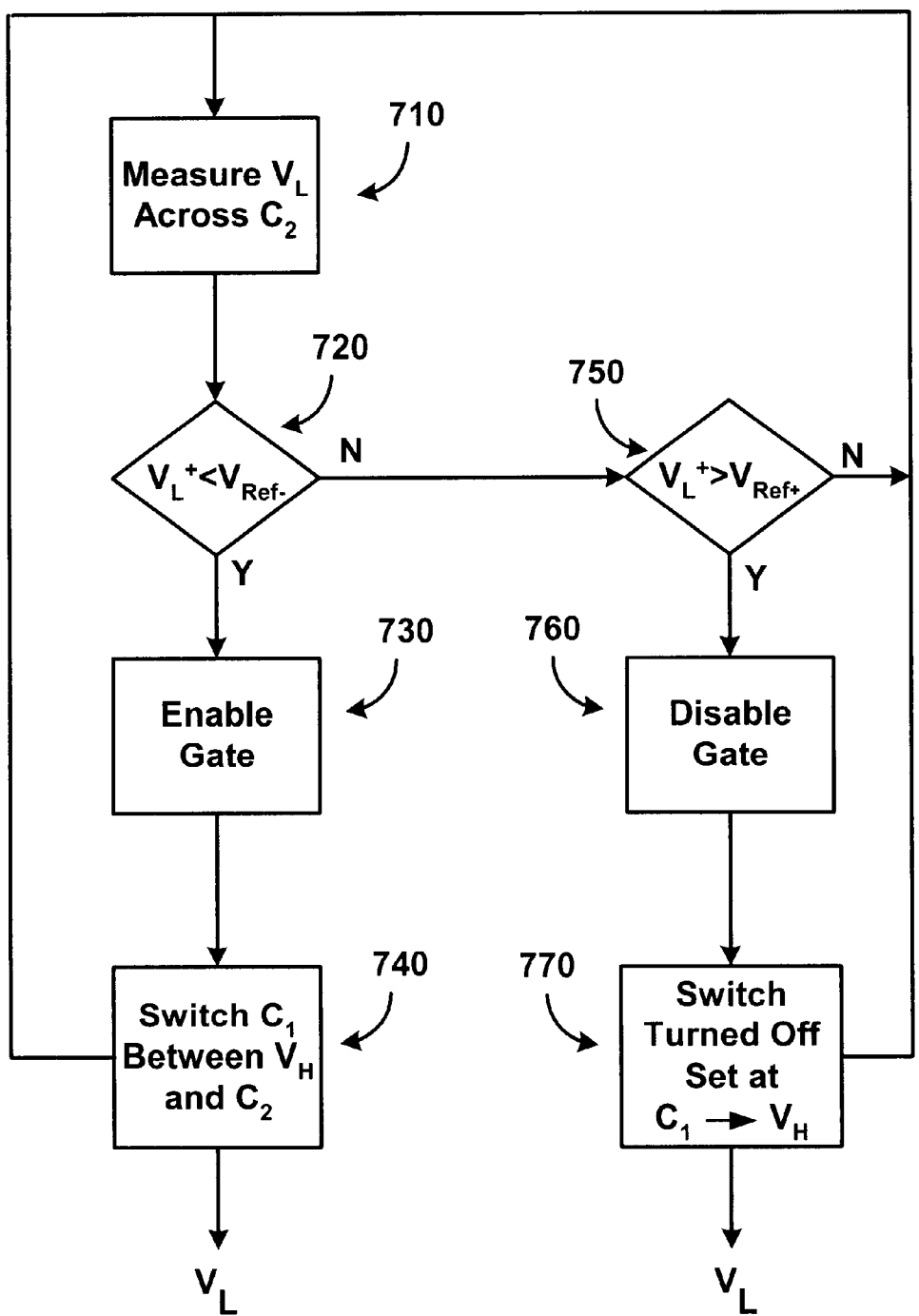
FIG. 7 is a flow chart illustrating a general method for controlling the charge pump of FIG. 6.

FIG. 7 is a flow chart illustrating a general method for controlling the charge pump 160 of FIG. 6. The method begins with a measurement or sampling of the voltage across $C_2$ 142 (block 710). From that, the internal supply voltage ($V_L^+$) 150 being supplied to the amplifier stage 130 can be determined. $V_L^+$ is compared to $V_{ref}$ and if $V_L^+$ is less than $V_{ref}$ then it is determined that more voltage should be supplied to the amplifier stage 130 and so more charge should be transferred to $C_2$ 142 (step 720). The comparator 230 of the switch control circuit 200 will typically perform the comparison. The switch control gate 240 becomes enabled (block 730) and so a clock signal is passed through the gate 240 to the switches $S_1$ 144A and $S_2$ 144B. $S_1$ 144A and $S_2$ 144B switch between connecting $C_1$ 140 to $V_H$ 148 and $C_2$ 142 so as to transfer charge from $V_H$ 148 to $C_2$ 142 (block 740). The regulated internal supply voltage, $V_L^+$, is supplied to the amplifier stage 130. It should be noted that $V_L^+$ could be supplied to some other load and need not be supplied to an amplifier stage 130.

If it was determined that $V_L^+$ was greater than $V_{ref}$ then a second comparison could be made to see if $V_L^+$ was greater than the upper threshold voltage ($V_{ref}^+$) (step 750). $V_{ref}^+$, typically, would be a design parameter of the switch control circuit 200 and related to $V_{ref}$. The closer $V_{ref}^+$ was to $V_{ref}$, the more accurate $V_L^+$ could be. The tradeoff comes in the precision of the components used to measure $V_L^+$ and produce $V_{ref}$. If $V_L^+$ was determined to be above $V_{ref}^+$ then the switch control gate 240 could be disabled (block 760) thereby blocking the clock signal from passing through to $S_1$ 144A and $S_2$ 144B. The switches would be turned off and default set to connect $C_1$ 140 to $V_H$ 148 so as to charge $C_1$ 140. $C_2$ 142 would release charge to the load (in this case the amplifier stage 130) thereby supplying $V_L^+$ to the load (block 770).

If it was determined that $V_L^+$ was not greater than $V_{ref}^+$, then the process would start over by sampling or measuring the voltage across $C_2$ 142. In this case, $V_L^+$ is within the desired tolerance. This process could repeat continuously, therefore regulating $V_L^+$.

It should be emphasized that the above described embodiments of the present invention are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

The following is claimed:

1. A line driver comprising:
    an amplifier stage configured to operate at various voltage levels, the amplifier stage having a power supply input for connection to a first external power supply;
    a charge pump configured to generate at least a first internal supply voltage supplied to the amplifier stage; and
    a switch control circuit configured to regulate the voltage output from the charge pump.

2. The line driver of claim 1, wherein the line driver includes a second power supply input for connection to a second external power supply.

3. The line driver of claim 2, wherein the second external supply is ground.

4. The line driver of claim 2, further comprising:
    a voltage divider coupled with the first and second external supplies, wherein the voltage divider is configured to produce at least a first reference voltage, wherein the reference voltage(s) are output to the switch control circuit; and
    a buffer amplifier coupled with the voltage divider, wherein the buffer amplifier is configured to supply a second internal supply voltage to a third power supply input of the amplifier stage.

5. The line driver of claim 4, wherein the charge pump further comprises:
    a first capacitor, wherein the first capacitor has a first terminal and a second terminal;
    a second capacitor, wherein the second capacitor has a first terminal, the first terminal of the second capacitor is coupled with a fourth supply input of the amplifier stage and the second capacitor has a second terminal, the second terminal of the second capacitor is coupled with the third power supply input of the amplifier stage;
    a first switch, wherein the first switch is connected to the first terminal of the first capacitor and configured to switch between connecting the first terminal of the first capacitor to the first external power supply and the first terminal of the second capacitor; and
    a second switch, wherein the second switch is connected to the second terminal of the first capacitor and configured to switch between connecting the second terminal of the first capacitor to the second external power supply and the second terminal of the second capacitor, wherein the first and second switches are configured to switch simultaneously;
    wherein the charge pump is further configured to transfer charge from the first external supply voltage to the second capacitor via the first capacitor, wherein the transferred charge produces the first internal supply voltage in the second capacitor.

6. The line driver of claim 5, wherein the capacitance value of the first capacitor is greater than the capacitance value of the second capacitor.

7. The line driver of claim 5, wherein the switch control circuit is further configured to regulate the amount of charge transferred from the first external supply voltage to the second capacitor.

8. The line driver of claim 7, wherein the switch control circuit further comprises:
    a timing circuit configured to produce a timing signal, wherein the timing signal synchronously switches the first and second switches at a given frequency;
    a comparator configured to produce a signal based on the comparison of the first internal supply voltage to the first reference voltage; and
    a control gate configured to pass the timing signal to the switches, wherein the control gate is enabled or disabled based upon the signal received from the comparator.

9. The line driver of claim 1, wherein the amplifier stage is a Class-G amplifier stage.

10. The line driver of claim 1, wherein the first internal supply voltage is less than the first external supply voltage.

11. A line driver comprising:
    means for amplifying a signal, the means for amplifying capable of operating at various voltage levels;
    means for generating at least a first internal supply voltage that is supplied to the means for amplifying; and
    means for regulating the means for generating at least the first internal supply voltage.

12. The line driver of claim 11, wherein the means for generating further comprises:
    means for storing at least the first internal supply voltage;
    means for transferring charge from a first external supply voltage to the means for storing at least the first internal supply voltage; and
    means for supplying a voltage from the stored first internal supply voltage to the means for amplifying.

13. The line driver of claim 12, wherein the means for regulating further comprises:
    means for regulating the transfer of charge from the first external supply voltage to the means for storing at least the first internal supply voltage.

14. The line driver of claim 11, wherein at least the first internal supply voltage is less than the first external supply voltage.

15. A system for providing various voltages to a load, wherein the system can generate and regulate a first internal supply voltage, wherein the first internal supply voltage is generated from a first external supply voltage and the first internal supply voltage is less than the first external supply voltage, the system comprising:
    a charge pump configured to generate the first internal supply voltage and configured to supply the first internal supply voltage to the load; and
    a switch control circuit configured to regulate a voltage output from the charge pump.

16. The system of claim 15, further comprising:
    a voltage divider coupled with the first and a second external supply voltages, wherein the voltage divider is configured to produce at least a first reference voltage, wherein the reference voltage(s) are output to the switch control circuit; and
    a buffer amplifier coupled with the voltage divider, wherein the buffer amplifier is configured to supply a second internal supply voltage to the load.

17. The system of claim 16, wherein the charge pump further comprises:
    a first capacitor, wherein the first capacitor has a first terminal and a second terminal;
    a second capacitor, wherein the second capacitor has a first terminal and a second terminal, the second capacitor being connected in parallel to the load;
    a first switch, wherein the first switch is connected to the first terminal of the first capacitor and configured to switch between connecting the first terminal of the first capacitor to the first external supply voltage and the first terminal of the second capacitor; and
    a second switch, wherein the second switch is connected to the second terminal of the first capacitor and configured to switch between connecting the second terminal of the first capacitor to the second external supply voltage and the second terminal of the second capacitor, wherein the first and second switches are configured to switch simultaneously;
    wherein the charge pump is further configured to transfer charge from the first external supply voltage to the second capacitor via the first capacitor, wherein the transferred charge produces the first internal supply voltage in the second capacitor.

18. The system of claim 17, wherein the first capacitor is greater than the second capacitor.

19. The system of claim 17, wherein the switch control circuit is further configured to regulate the amount of charge transferred from the first external supply voltage to the second capacitor.

20. The system of claim 19, wherein the switch control circuit further comprises:
    a timing circuit configured to produce a timing signal, wherein the timing signal synchronously switches the first and second switches at a given frequency;
    a comparator configured to produce a signal based on the comparison of the first internal supply voltage to the first reference voltage; and
    a control gate configured to pass the timing signal to the switches, wherein the control gate is enabled or disabled based upon the signal received from the comparator.

21. The system of claim 16, wherein the second external supply voltage is ground.

22. A method for supplying various voltages to a load, the method comprising the steps of:
    generating a first internal supply voltage from a first external supply voltage, wherein the first internal supply voltage is less than the first external supply voltage;
    supplying the first internal supply voltage to the load; and
    regulating the generation and supply of the first internal supply voltage.

23. The method of claim 22, wherein the step for generating further comprises the steps of:
    transferring charge from the first external supply voltage to a storage device; and
    storing the transferred charge in the storage device to generate the first internal supply voltage.

24. The method of claim 23, wherein the step for supplying further comprises the step of:
    discharging the stored charge to the load, whereby supplying at least the first internal supply voltage from the storage device to the load.

25. The method of claim 23, wherein the step for regulating further comprises the steps of:
    monitoring the discharge of the stored charge to the load; and
    regulating the transfer of charge from the first external supply voltage to the storage device.

* * * * *